(12) United States Patent
Chiba et al.

(10) Patent No.: US 7,928,820 B2
(45) Date of Patent: Apr. 19, 2011

(54) SUPERCONDUCTING MAGNET AND MAGNETIC RESONANCE IMAGING APPARATUS

(75) Inventors: Tomoo Chiba, Hitachi (JP); Hiroyuki Watanabe, Hitachi (JP); Hirotaka Takeshima, Ryugasaki (JP); Shigeki Tounosu, Hitachi (JP); Mitsushi Abe, Hitachinaka (JP); Hiroyuki Takeuchi, Kashiwa (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 268 days.

(21) Appl. No.: 12/358,612

(22) Filed: Jan. 23, 2009

(65) Prior Publication Data
US 2009/0189721 A1    Jul. 30, 2009

(30) Foreign Application Priority Data

Jan. 24, 2008   (JP) ................... 2008-013577

(51) Int. Cl.
*H01F 6/00*   (2006.01)
*G01V 3/00*   (2006.01)

(52) U.S. Cl. .......... 335/216; 324/318; 324/320; 62/51.1

(58) Field of Classification Search .................. 335/216; 324/318–320; 62/51.1
See application file for complete search history.

(56) References Cited

U.S. PATENT DOCUMENTS

| 6,100,780 | A * | 8/2000 | Dorri et al. ..................... 335/216 |
| 6,864,770 | B2 * | 3/2005 | Nemoto et al. ............... 335/216 |
| 7,126,448 | B2 * | 10/2006 | Watanabe et al. ............. 335/216 |
| 2008/0024254 | A1 * | 1/2008 | Chiba et al. ................... 335/216 |
| 2008/0191697 | A1 * | 8/2008 | Chiba et al. ................... 324/318 |

FOREIGN PATENT DOCUMENTS

| JP | 10-097917 | 4/1998 |
| JP | 2001-224571 | 8/2001 |
| JP | 2005-144132 | 6/2005 |

* cited by examiner

*Primary Examiner* — Ramon M Barrera
(74) *Attorney, Agent, or Firm* — Mattingly & Malur, P.C.

(57) ABSTRACT

In a superconducting magnet, including a vacuum vessel, a coil vessel inside the vacuum vessel, and a superconducting coil inside the coil vessel for generating a magnetic field, has a magnetic member, disposed inside the vacuum vessel, supported with thermal insulation, for compensating the magnetic field; a heat exchange device disposed outside the vacuum vessel for supplying to or absorbing heat from the vacuum vessel; and thermal conducting members thermally connecting the heat exchange device via the vacuum vessel to the magnetic member. An MRI including the superconducting magnet is also disclosed.

13 Claims, 6 Drawing Sheets

SUPERCONDUCTING MAGNET AND MAGNETIC RESONANCE IMAGING APPARATUS

CROSS REFERENCE TO RELATED APPLICATIONS

This application claims the foreign priority benefit under Title 35, United States Code, §119(a)-(d) of Japanese Patent Application No. 2008-013577, filed on Jan. 24, 2008 in the Japan Patent Office, the disclosure of which is herein incorporated by reference in its entirety.

BACKGROUND OF THE INVENTION

1. Field of the Invention

The present invention relates to a superconducting magnet and a magnetic resonance imaging (MRI) apparatus using the same, and particularly to a superconducting magnet for an open type of magnetic resonance imaging apparatus and an MRI apparatus using the same.

2. Description of the Related Art

An MRI (Magnetic Resonance Imaging) apparatus including a superconducting magnet for generating a tomographic image of a subject on the basis of hydrogen nuclear density by measuring electromagnetic waves emitted by hydrogen nuclear spin based on the nuclear magnetic resonance (NMR) phenomenon is known.

Because an electromagnetic field generated by an electromagnetic wave emitted by a hydrogen nuclear spin is proportional in intensity to a static magnetic field in the measurement region, it is necessary to increase an intensity of the static magnetic field to improve a resolution of the tomographic image. To generate a high intensity static magnetic field, a superconducting magnet is used. Further, it is necessary to increase homogeneousness in magnetic field in the measurement region to obtain a high image quality and high resolution without distortion in the tomographic image. Accordingly, a magnetic member may be disposed in the superconducting magnet. Further, an MRI apparatus using a magnetic member for improving homogeneousness in magnetic field intensity in a measurement region to suppress distortion in the tomographic image is known. In the MRI apparatus, a homogeneous magnetic field with a high intensity and a high homogeneousness in the static magnetic field (magnetic flux density) can be generated in the measurement region.

Generally, the magnetic member is disposed in the atmosphere at a room temperature. On the other hand, JP 2001-224571 A and JP 10-97917 A disclose MRI apparatuses including such a magnetic member disposed in a coil vessel filled with liquid helium having a cryogenic temperature for cooling superconducting coils. Further, JP 2005-144132 A discloses an MRI apparatus including such a magnetic member in a thermal shield at a middle low temperature for covering a coil vessel having a cryogenic temperature to shield the coil vessel from a heat radiated from the vacuum vessel.

SUMMARY OF THE INVENTION

An aspect of the present invention provides a superconducting magnet, comprising: an annular superconducting coil that generates a magnetic field; a coil vessel that contains the superconducting coil with a refrigerant; a vacuum vessel that has a vacuum space therein and encloses the coil vessel in the vacuum space; a magnetic member disposed in the vacuum space and supported by the coil vessel with thermal insulation that compensates the magnetic field; a heat exchange device disposed outside the vacuum vessel that is thermally connected to the vacuum vessel to supply heat to the vacuum vessel or absorbs heat from the vacuum vessel; and a thermal conducting member disposed in the vacuum space that is thermally connected to the magnetic member and the heat exchange device via the vacuum vessel.

Another aspect of the present invention provides a magnetic resonance imaging apparatus comprising: a superconducting magnet based on the first aspect; a radio frequency coil for receiving a nuclear magnetic resonance signal from a given location of the subject; and a control unit for analyzing the nuclear magnetic resonance signal to generate a magnetic resonance image.

According to the aspects, there may be provided a superconducting magnet and an MRI apparatus capable of changing the temperature of the magnetic member in a short interval to reduce temperature variation of the magnetic member against a long-term variation in the room temperature with small variation in homogeneousness in the magnetic field intensity.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Prior to describing an embodiment of the present invention, the above-mentioned related art will be further explained.

In the case where the magnetic member is disposed in the atmosphere at a room temperature, it is considered that homogeneousness in the static magnetic intensity varies because of variation in dimension of the magnetic member in accordance with variation in the temperature of the magnetic member depending on the room temperature. In the case where the magnetic member is disposed in the coil vessel, the temperature of the magnetic member does not vary in accordance with variation in the room temperature. However, the magnetic member, being disposed in the coil vessel, is away from the measurement region having a high homogeneousness in the static magnetic field. This decreases influence sensitivity by the magnetic field on the homogeneousness in the static magnetic field. Further, in the case where the magnetic member is disposed in the thermal shield, where a heat capacity of the thermal shield substantially increases, which results in a long cooling time.

Then, it may be considered that the magnetic member is disposed in the vacuum vessel at a room temperature. This can suppress a temperature variation of the magnetic member in accordance with variation in the room temperature because the magnetic member is disposed in vacuum. Further since a distance between the magnetic member and the measurement region having high homogeneousness in the static magnetic field is made shorter, the influence sensitivity on the measurement region having a high homogeneousness in the static magnetic field can be increased. Further, in this arrangement, supporting the magnetic member with thermal insulation in the coil vessel prevents the magnetic member from being disposed on the thermal shield.

However, there may be two problems in the case where the magnetic member is disposed in the vacuum vessel at a room temperature.

First, since the magnetic member is in vacuum, the temperature of the magnetic member does not vary. However, the temperature of the magnetic member gradually varies as the room temperature varies over a long term such as season variation. This variation varies dimensions of the magnetic member, which varies the homogeneousness in the intensity of the static magnetic field.

Second, since the temperature of the magnetic member varies only gradually, if the superconducting magnet is carried and installed at another location, the temperature of the magnetic member may increase. Once having varied by some causes, the temperature of the magnetic member does not become constant, so that it takes long time for the homogeneousness in the intensity of the magnetic field to become constant. Accordingly, the temperature of the magnetic field cannot be restored in a short time interval.

The present invention provides a superconducting magnet and an MRI apparatus capable of varying the temperature of the magnetic member in the short interval to reduce temperature variation of the magnetic member against a long term variation in the room temperature with a small variation in homogeneousness in the magnetic field intensity and capable of changing the magnetic member in temperature within a short time interval.

First Embodiment

With reference to drawings will be described a first embodiment of the present invention.

Figure 1:
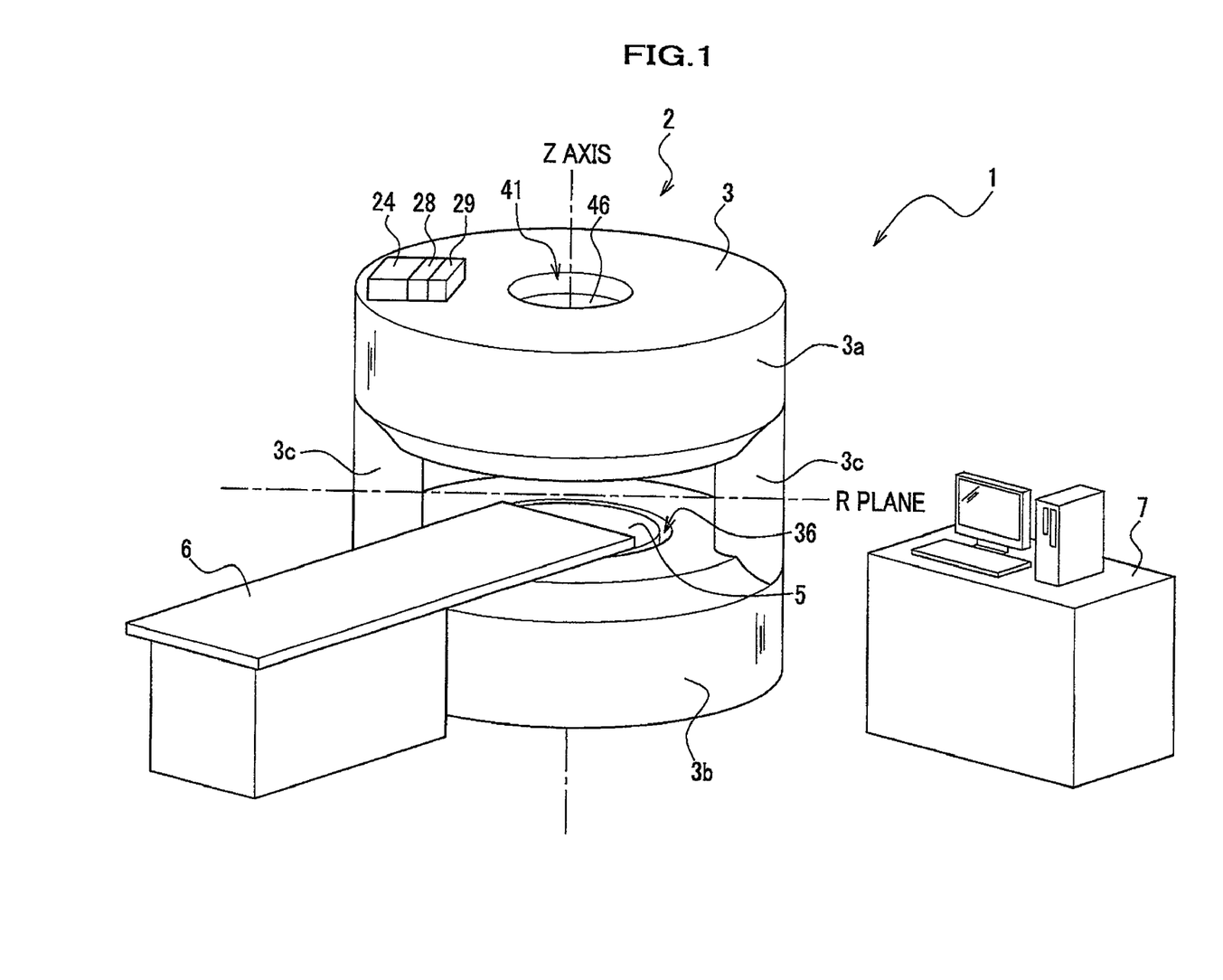
FIG. 1 is a perspective view of an MRI apparatus including a superconducting magnet according to first and second embodiments of the present invention.

FIG. 1 shows an open type of MRI apparatus exemplified as an MRI apparatus 1. The open type of MRI apparatus includes a superconducting magnet 2, a radio frequency coil 5, a bed 6 for supporting a subject, and a control unit 7 for controlling the superconducting magnet 2, the radio frequency coil 5, and the bed 6 to analyze a nuclear magnetic resonance signal from a given location of the subject. The superconducting magnet 2 includes a vacuum vessel 3 for keeping the inside thereof vacuum to have a vacuum space, temperature controllers 24, first power supplies 28 and second power supplies 29 of which outputs are controlled by the temperature controllers 24, respectively. The vacuum vessel 3 includes hollows 36 and 41 where the wall of the vacuum vessel 3 is hollowed, a pair of first and second vacuum vessels 3a and 3b vertically disposed, and vacuum connecting tubes 3c. On the second vacuum vessels 3b two vacuum connecting tubes 3c are stood. These vacuum connecting tubes 3c support the first vacuum vessel 3a. The vacuum connecting tubes 3c, being communicated with the first and second vacuum vessels 3a and 3b, equalize the first and second vacuum vessels 3a and 3b in a reduced inner air pressure state therein.

The open type of MRI apparatus is provided to diagnose a subject placed between the first and second vacuum vessels 3a and 3b spaced by the vacuum connecting tubes 3c. This provides an open space feeling to the subject because of open sight. In the hollow 36, the radio frequency (RF) coil 5 is disposed. The hollow 41 is filled with a thermal insulator 46 such that the thermal insulator covers hollow 41. The first and second vacuum vessels 3a and 3b have cylindrical shapes having a common center axis on the Z axis. Further, the first and second vacuum vessels 3a and 3b have shapes which are plane-symmetrical about an R plane having a normal on the Z axis.

Figure 2:
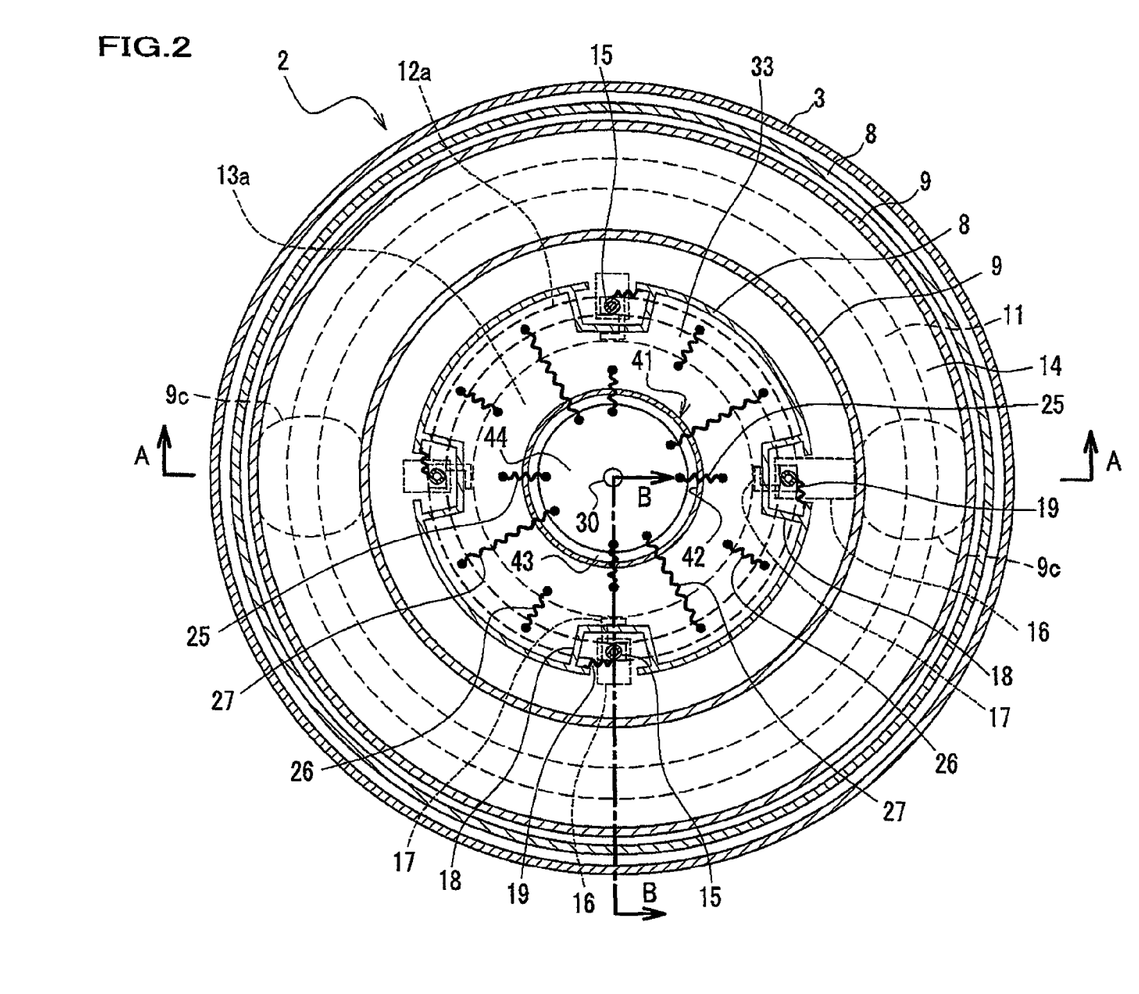
FIG. 2 is a cutaway plan view of the superconducting magnet shown in FIG. 1.
Figure 3:
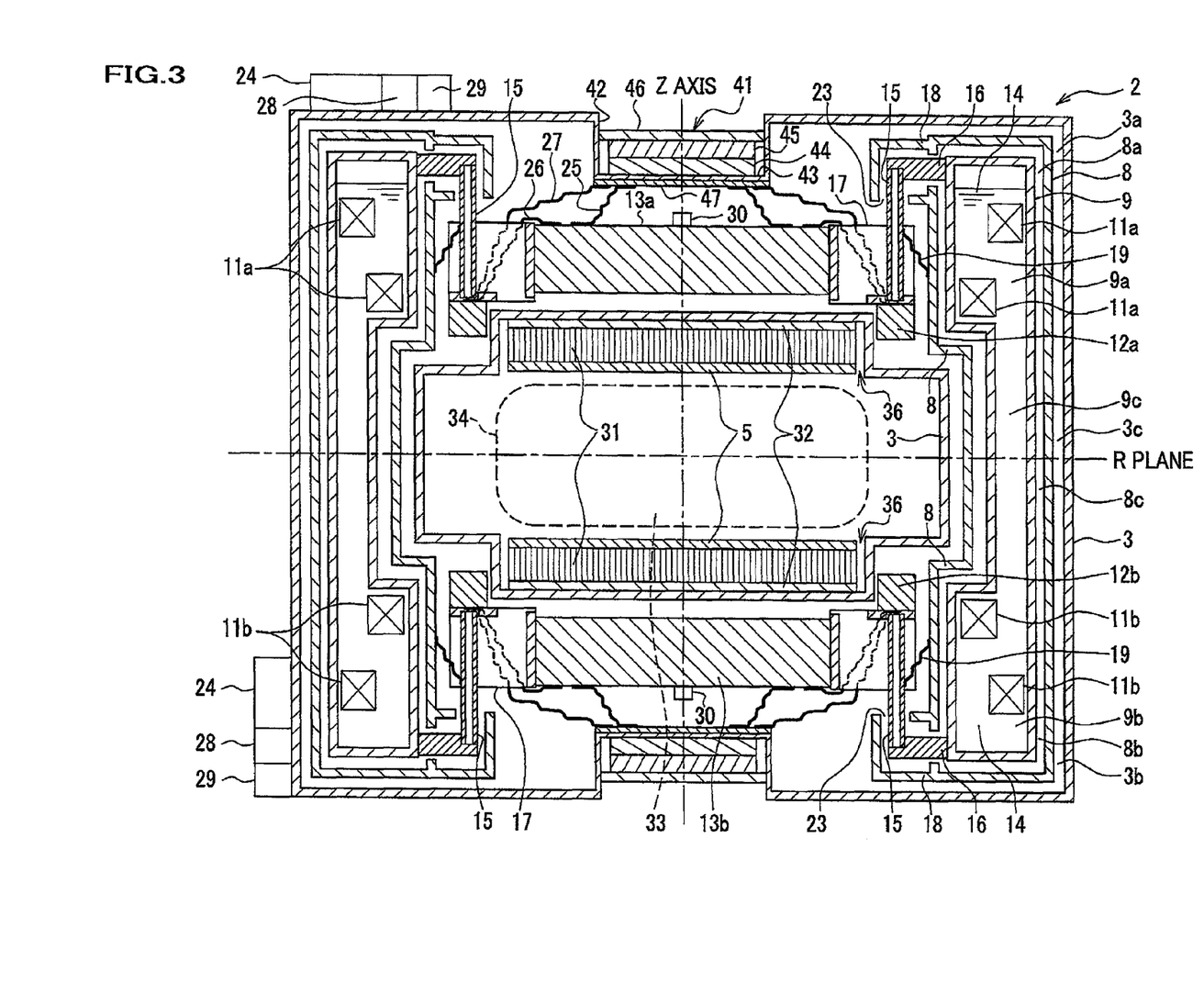
FIG. 3 is a sectional view taken along line A-A in FIG. 2.
Figure 4:
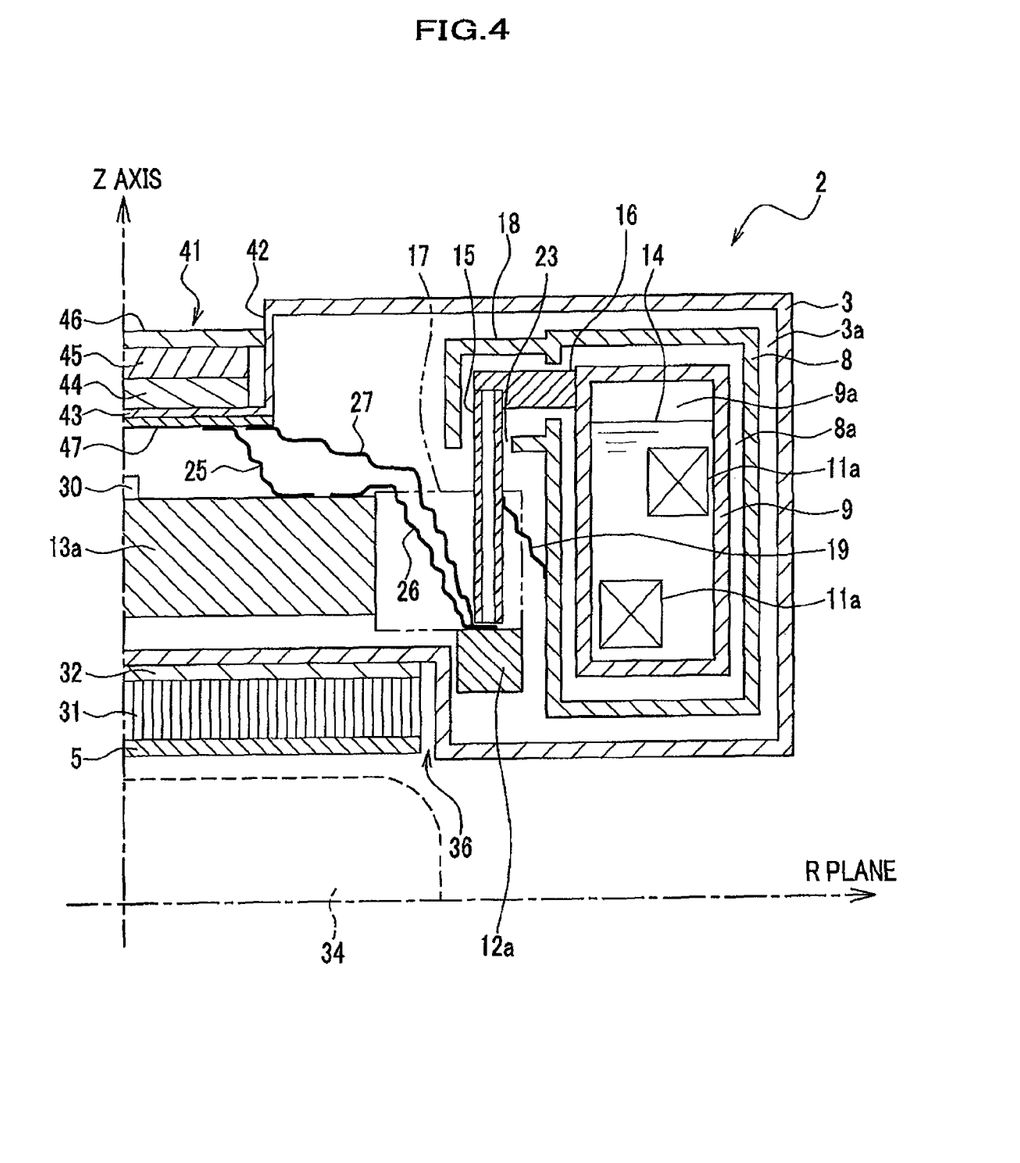
FIG. 4 is a sectional view of an upper half of the superconducting magnet taken along line B-B in FIG. 2.

FIG. 2 is a cutaway plan view of the superconducting magnet 2. FIG. 3 is a sectional view of the superconducting magnet taken along line A-A in FIG. 2, and FIG. 4 is a sectional view of an upper half of the superconducting magnet taken along line B-B in FIG. 2.

As shown in FIG. 3, the superconducting magnet 2 includes two pairs of superconducting coils 11a and 11b having annular shapes with center axes on the Z axis for generating a homogeneous magnetic field region 34 by allowing a persistent current to flow, a coil vessel 9 for containing the superconducting coils 11a and 11b together with a refrigerant 14, a thermal shield 8 provided to enclose the coil vessel 9, a vacuum vessel 3, the inside of which is kept in vacuum. The superconducting magnet 2 further includes magnetic members 12a, 12b, 13a, and 13b for compensating the magnetic filed of the homogeneous magnetic field region 34 disposed inside the vacuum vessel 3, outside the thermal shield 8 and supported by coil vessel 9 with thermal insulation. A magnetic flux in the magnetic field generated in the homogeneous magnetic field region 34 is parallel to the Z axis, and the subject is carried to be moved through the homogeneous magnetic region 34 to conduct a diagnosis by tomographic imaging.

Liquid helium (He) is used as the refrigerant 14 which directly cools the superconducting coils 11a and 11b. The coil vessel 9 contains the superconducting coils 11a and 11b having annular shapes with a center axis on Z axis so as to extend along the superconducting coils 11a and 11b to be housed. Similarly, the thermal shield 8 contains the coil vessel 9 having torus shapes so as to extend along the coil vessel 9 in which a surface area is decreased as much as possible to prevent heat from entering.

In a case where the superconducting magnet 2 is installed in a room at a room temperature, because the inside of the vacuum vessel 3 is a vacuum, the heat in the room is not transmitted to the coil vessel 9 by heat conduction or heat convection. Further, the thermal shield 8, being cooled with a refrigerator (not shown), absorbs a radiation heat from the vacuum vessel 3 and releases the heat toward the refrigerator, so that a temperature of the coil vessel 9 does not increase by the radiation heat. The thermal shield 8 is set to a middle low temperature between the cryogenic temperature of the refrigerant 14 and the room temperature. Accordingly, the superconducting coils 11a and 11b and the coil vessel 9 are set to be stable in the cryogenic temperature of the refrigerant 14.

The magnetic members 12a and 12b for compensating the magnetic field have an annular shape with canter axis on the Z axis and have an outside diameter smaller than the inner diameter of the superconducting coils 11a and 11b. The magnetic members 13a and 13b for compensating the magnetic field have a cylindrical shape with central axis on the Z axis and have a diameter smaller than inner diameters of the magnetic members 12a and 12b.

The coil vessel 9 includes a first coil vessel 9a enclosing the superconducting coil 11a, a second coil vessel 9b, disposed apart from the first coil vessel 9a, enclosing the superconducting coil 11b, the coil connecting tubes 9c for connecting the first and the second coil vessels 9a and 9b where the refrigerant 14 can pass therethrough. The coil connecting tubes 9c are disposed on peripheral parts of the first and second coil vessels 9a and 9b. The number of the coil connecting tube 9c may be one or more.

The thermal shield 8 includes a first thermal shield 8a enclosing the first coil vessel 9a, a second thermal shield 8b disposed away from the first thermal shield 8a for enclosing the second coil vessel 9b, and shield connecting tubes 8c enclosing the coil connecting tube 9c for communicating the first thermal shield 8a with the second thermal shield 8b. The shield connecting tube 8c is disposed on the outer peripheral parts of the first thermal shield 8a and the second thermal shield 8b. The number of the shield connecting tube 8c is one or more in accordance with the number of the coil connecting tube 9c.

The vacuum vessel 3 includes a first vacuum vessel 3a enclosing the first coil vessel 9a, the first thermal shield 8a, and the magnetic members 12a and 13a, a second vacuum vessel 3b disposed apart from the first vacuum vessel 3a for enclosing the second coil vessel 9b and the second thermal shield 8b, and magnetic members 12b and 13b, and vacuum tube connecting tubes 3c connecting the first and the second vacuum vessels 3a and 3b and enclosing the coil connecting tubes 9c and the shield connecting tubes 8c. The vacuum connecting tubes 3c are disposed at the outer peripheral parts of the first and second vacuum vessels 3a and 3b. The number of the vacuum vessels 3c is one or more in accordance with the number of the coil connecting tubes 9c.

As mentioned above, a pair of the first coil vessel 9a and the second coil vessel 9b, a pair of the first thermal shield 8a and the second thermal shield 8b, and a pair of the first vacuum vessel 3a and the second vacuum vessel 3b, and a pair of the magnetic members 12a and 12b, and a pair of the magnetic members 13a and 13b such that two (at least one) pairs of superconducting coils 11a and 11b are disposed oppositely. This generates the homogeneous magnetic field region 34 between the first and second vacuum vessels 3a and 3b. The superconducting magnet 2 has a structure substantially line-symmetrical about the Z axis and plane-symmetrical about the R plane.

Further, the superconducting coils 11a and 11b are supported by the coil vessel 9, and the thermal shield 8 is supported by the coil vessel 9 with thermal insulation. The coil vessel 9, having a great total weight, is supported with thermal insulation by the vacuum vessel 3 which serves as a base.

In the hollows 36 which are hollowed walls of the first and second vacuum vessels 3a and 3b facing each other, from the homogeneous magnetic field region 34 toward the vacuum vessel 3, the radio frequency coil 5, a gradient magnetic coil 31, and a shim plate 32 capable of precisely adjusting the magnetic field of the homogeneous magnetic field region 34, are disposed in this order. The radio frequency coils 5, the gradient magnetic coils 31, and the shim plates are fixed to the first and second vacuum vessel 3a and 3b, respectively. The MRI apparatus 1 measures a nuclear magnetic resonance signal emitted by hydrogen nuclear spins by the NMR phenomenon and computes the nuclear magnetic resonance signal to generate a tomographic image of the subject on the basis of the hydrogen nuclear density. In this process, the homogeneous magnetic field region 34 into which the subject is to be inserted has a high intensity of static magnetic field more than 0.2 T with a high homogeneousness of the static magnetic field. A pair of the gradient coils 31 above and below the homogeneous magnetic field region 34 apply a gradient magnetic field in which an intensity of the magnetic field spatially varies to the homogeneous magnetic field region 34 to obtain positional information in the homogeneous magnetic field region 34. Further, a pair of radio frequency coils 5 above and below the homogeneous magnetic field 34 apply to the homogeneous magnetic field 34 an electromagnet wave having a resonance frequency for causing the NMR phenomenon. With this structure, the nuclear magnetic resonance signal emitted by hydrogen nuclear spins is measured at every minute region within the homogeneous magnetic field region 34 and is operated to generate the tomographic image of the body of the subject on the basis of the hydrogen nuclear density.

Further, when the gradient magnetic coils 31 are electrically conducted to generate the gradient magnetic field, an electromagnetic force acts on the gradient magnetic coil 31, which vibrates the gradient magnetic filed coil 31 and the vacuum vessel 3 fixing the gradient magnetic filed coil 31. Since there is a tendency that vibrations are not easily transmitted to the magnetic members 12a, 12b, 13a, and 13b connected through only the first thermal conducting members 25 and 27, the magnetic members 12a, 12b, 13a, and 13b do not vibrate. Further, the positional relation between the superconducting coils 11a and 11b and the magnetic members 12a, 12b, 13a, and 13b does not change, so that the homogeneousness of the homogenous magnetic field does not vary.

As shown in FIGS. 2, 3, and 4, the magnetic members 12a and 13a are connected integrally with connecting members 17 which are non-magnetic and metallic. Further, the magnetic members 12b and 13b are connected integrally with connecting members 17 which are non-magnetic and metallic. The integrally connected magnetic member 12a and 13a and integrally connected magnetic members 12b and 13b, i.e., loads, are supported through a thermal insulation support rod 15 by the coil vessel 9. The support rod 15 comprises such a material that a thermal conduction from the magnetic members 12a, 12b, 13a, and 13b to the coil vessel 9 can be decreased in supporting the magnetic members 12a, 12b, 13a, and 13b at the room temperature from the coil vessel 9 at the liquid helium temperature. For example, a fiber-reinforced plastic (FRP) pipe having a low thermal conductivity is used as the support rod 15. Further, an FRP having a plate shape or a bar shape may be used instead the pipe shape. The support rods 15 are installed so as to vertically stand in parallel to the Z axis. One end of each support rod 15 is fixed to the connecting member 17, and the other end is fixed to the coil vessel 9 through a connecting member 16 which is non-magnetic and metallic. The connecting members 16 connect the support rods 15 and the coil vessel 9. The magnetic members 12a, 12b, 13a, and 13b are supported by the support rods 15.

The support rods 15 are provided so as to pierce the thermal shield 8 through though-holes 23. This allows the magnetic members 12a, 12b, 13a, and 13b to be disposed outside the thermal shield 8, and not to be covered with the thermal shield 8. The thermal shield 8 is provided with a thermal shield bag 18 to cover the connecting member 16. The thermal shield bag 18 is provided with through-holes 23 through which the support rods 15 pierce the thermal shield 8.

The magnetic members 12a, 12b, 13a, and 13b are disposed in vacuum in the vacuum tube 3. However, the magnetic members 12a, 12b, 13a, and 13b are disposed outside the thermal shield, so that the temperatures of the magnetic members 12a, 12b, 13a, and 13b approximately become the room temperature by the heat radiation from the vacuum vessel 3. Further, the temperatures of the magnetic members 12a, 12b, 13a, and 13b are kept substantially at the room temperature because the magnetic members 12a, 12b, 13a, and 13b are supported with thermal insulation from the coil vessel 9 having the cryogenic temperature. In this operation, because the magnetic members 12a, 12b, 13a, and 13b have large heat capacities, the temperatures of the magnetic members 12a, 12b, 13a, and 13b do not depend on the temperature variation of the vacuum vessel 3 caused by a shot-term variation in the room temperature. This does not vary the magnetic members 12a, 12b, 13a, and 13b in position and dimension.

Because the magnetic members 12a, 12b, 13a, and 13b are not supported by the thermal shield 8, heat is not conducted from the thermal shield 8. Accordingly, temperature variations of the magnetic members 12a, 12b, 13a, and 13b are not easily caused by the temperature variation of the thermal shield 8. This does not easily cause variation in position and dimension of the magnetic members 12a, 12b, 13a, and 13b, so that there is no possibility that the homogeneousness of the magnetic field decreases. Accordingly, when the temperature of the thermal shield 8 increases due to stop of the refrigerator (not shown) by a power failure or the like, the variation in the homogeneousness of the magnetic field in the homogenous magnetic field region 34 can be suppressed. Further, in case of quenching or the like in the superconducting coils 11a and 11b, where an excessive electromagnetic force may be applied to the thermal shield 8, which may vary the position of the thermal shield 8 as the result of plastic deformation, the homogeneousness of the magnetic field will not vary. This is because the positional relation does not vary between the superconducting coils 11a and 11b and the magnetic members 12a, 12b, 13a, and 13b.

Further, a middle location in a longitudinal direction of the support rod 15 serves as a thermal anchor and is connected to the thermal shield 8 through a thermal conducting flexible member 19. The thermal conducting flexible member 19 does not support loads of the support rod 15 and the thermal shield 8 which are connected to both ends of the thermal conducting flexible member 19, but well conducts heat. This qualifies a temperature of the middle point of the support rod 15 to the temperature of the thermal shield 8. This structure makes constant a temperature profile from one end of the support rod 15 to the other end, i.e., the room temperature to the cryogenic temperature.

The vacuum vessel 3 has hollows 41. The hollow 41 includes a side wall 42 having a sleeve shape and a bottom 43 having a disk shape. The hollows 41 are provided at an upper face of the first vacuum vessel 3a and a bottom of the second vacuum vessel 3b, respectively. On the bottoms 43 of the hollows 41, first heat exchange devices 44 are disposed. The first heat exchange device 44 is located on a side of room temperature in the atmosphere, and thermally coupled to the vacuum vessel 3 to supply or absorb heat. More specifically, a pair of first heat exchange devices (first heat generating and absorbing devices) 44 are disposed correspondingly on the first and second vacuum vessels 3a and 3b.

A second heat exchange devices (second heat generating and absorbing devices) 45 can be provided adjacent to the first heat exchange devices 44 outside the vacuum vessel 3. The second heat exchange device 45 is also thermally coupled to the vacuum vessel 3 with capacity of supplying and absorbing heat greater than that of the first heat exchange device 44. Further, the second heat exchange devices 45 are detachable from the vacuum vessel 3. The thermal insulators 46 are provided in the hollows 41 so as to cover the first and second heat exchange devices 44 and 45.

The first thermal conducting members 25 and 27 are disposed inside the vacuum vessel 3 and are thermally connected (coupled) to the vacuum vessel 3 and the magnetic members 12a, 12b, 13a, and 13b. The second thermal conducting members 26 are also disposed inside the vacuum vessel 3 and thermally coupled between the magnetic members 12a and the magnetic members 13a (a plurality of magnetic members) disposed apart from each other and between the magnetic members 12b and 13b disposed apart from each other. The first thermal conducting members 25 and 27 face the first heat exchange device 44 through the bottom (wall) 43 of the hollow 41 in the vacuum vessel 3.

A plurality of (four) first thermal conducting members 27 are thermally connected (coupled) to the vacuum vessel 3 and the magnetic member 12a, respectively. A plurality of (four) first thermal conducting members 25 are thermally connected to the vacuum vessel 3 and the magnetic member 13a. A plurality of (four) first thermal conducting members 27 are thermally connected to the vacuum vessel 3 and the magnetic member 12b. A plurality of (four) first thermal conducting members 25 are thermally connected to the vacuum vessel 3 and the magnetic member 13b. The number of the first thermal conducting members 25 and 27 ranges from several to tens.

As mentioned above, providing a plurality of the first thermal conducting members 25 and 27 decreases a range of temperature distribution in each of the magnetic members 12a, 12b, 13a, and 13b. However, it is not always necessary to make temperatures even without temperature distribution, but it is sufficient that a range of the temperature distribution is small without any temperature shift during operation of the superconducting magnet 2 and the temperature does not vary. A degree of smallness in thermal distribution range is such that homogeneousness in magnetic field intensity of the homogeneous magnetic field region 34 can be adjusted by adding a magnetic member with the shim plate 32. The first thermal conducting members 25 and 27 supply heat to or absorb heat from the first heat exchange deice 44 therethrough. This can set the temperatures of the magnetic members 12a, 12b, 13a, and 13b constant and unchanged without shift in temperature distributions respectively.

Imposed between the vacuum vessel 3 (on the bottom 43 of the hollow 41) and the first thermal conducting members 25 and 27 is a thermal conducting plate 47. The thermal conducting plate 47 thermally connects to the vacuum vessel 3 (the bottom 43 of the hollow 41) and the first thermal conducting members 25 and 27. The thermal conducting plate 47 has a thermal resistance smaller than a wall of the vacuum vessel 3, for example, the bottom 43 of the hollow 41.

The first thermal conducting members 25 and 27 do not support loads of the thermal conducting plate 47 and the magnetic members 12a, 12b, 13a, and 13b which are connected to both ends thereof, but well conduct heat. With the structure, the heat conducted to the vacuum vessel 3 (bottom 43 of the hollow 41) from a heat source of the first heat exchange device 44 and the second heat exchange device 45 is further conducted through the first heat conducting members 25 and 27 to the magnetic members 12a, 12b, 13a, and 13b in addition to radiation of the heat. This can approximately equalize the temperatures of the magnetic members 12a, 12b, 13a, and 13b to that of the vacuum vessel 3 (bottom 43 of the hollow 41), that is, the temperatures of the first heat exchange device 44 and the second heat exchange device 45.

The second thermal conducting members 26 cannot support loads of the magnetic members 12a and 12b and the magnetic members 13a and 13b connected to both ends thereof, but well conduct heat. With the structure, the heat conducted to the magnetic members 12a, 12b, 13a, and 13b through the first thermal conducting members 25 and 27 is further conducted forwardly and backwardly by the connecting member 17 as well as by the second thermal conducting member 26 between the magnetic members 12a and 12b and the magnetic members 13a and 13b. This can more quickly, approximately equalize the temperatures of the magnetic members 12a, 12b, 13a, and 13b to that of the vacuum vessel 3 (bottom 43 of the hollow 41), that is, the temperatures of the first heat exchange device 44 and the second heat exchange device 45.

Further, a metal having flexibility with a low elastic constant can be used for the first thermal conducting members 25 and 27 and the second thermal conducting member 26. Because the magnetic members 12a, 12b, 13a, and 13b are supported by the coil vessel 9 with heat insulation, relative positional relations between the magnetic members 12a, 12b, 13a, and 13b and the vacuum vessel 3 vary by thermal contraction from the room temperature while the superconducting magnet 2 is manufactured and assembled to the cryogenic temperature during operation of the superconducting magnet 2. Accordingly, the first thermal conducting members 25 and 27 and the second thermal conducting member 26 should have flexibility for absorbing the displacement by the thermal contraction. Further, the flexibility in the first thermal conducting members 25 and 27 and the second thermal conducting member 26 prevents the magnetic members 12a, 12b, 13a, and 13b from vibrating in receiving affection of vibration of the vacuum vessel 3 facing the outside, which prevents homogeneousness in the homogenous magnetic field region 34 from varying. For example, as the first thermal conducting members 25 and 27 and the second thermal conducting member 26, a wiring, braid wire, or thin laminated plate made of copper (Cu) or aluminum (Al) can be used.

Further, it is preferable that the bottom 43 is formed integrally with the thermal conducting plate 47. In other words, the thermal conducting plate 47 serves as a partition between the atmosphere side and the vacuum side to provide a wider contact area between the first heat exchange device 44 and the first thermal conducting members 25 and 27. However, it is preferable that the thermal conducting plate 47 is made of a material with a high thermal conductivity, and thus there may be a case that the thermal conducting plate 47 cannot be made of the same metal material as the vacuum vessel 3 which requires a high stiffness. In the case, if the vacuum vessel 3 is weldable with the heat conducing plate 47, welding the vacuum vessel 3 with the thermal conducting plate 47 as a laminated integral structure provides such a structure. If the vacuum vessel 3 is made of a stainless steel, and the thermal conducting plate 47 is made of aluminum, welding connection is difficult. However, the vacuum vessel 3 and the thermal conducting plate 47 can be combined integrally by HIP or explosive bonding.

Further, a stainless steel plate with a minimum thickness necessary for supporting the atmospheric pressure is used for the bottom 43 in contact with the thermal conducting plate 47 to reduce a thermal resistance between the first heat exchange device 44 and the thermal conducting plate 47. Accordingly, a thickness of the vacuum vessel 3 in the hollow 41, i.e., thicknesses of the side wall 42 and the bottom 43, are made thinner than a thickness of walls of the vacuum vessel 3 other than the hollow 41. Further, a thickness of the side wall 42 in the hollow 41 is made thinner than the thickness of walls of the vacuum vessel 3 other than the hollow 41. Making the side wall 42 thinner increases a thermal resistance regarding thermal conduction from the bottom 43 to the other parts of the vacuum vessel 3 than the hollow 41. This makes heat not easy flow through the bottom 43 from the first heat exchange device 44 to other parts of the vacuum vessel 3 than the hollow 41, but easy flow to the thermal conducting plate 47. As mentioned above, the vacuum vessel 3 is provided with the hollow 41, and the first heat exchange device 44 is installed in the hollow 41 to conduct heat to be supplied or absorbed by the first heat exchange device 44 to the vacuum vessel 3 as less as possible, but to the thermal conducting plate 47 through the bottom 43 as much as possible. For this, it is preferable that the deeper the bottom 43 is made, and the side wall 42 and the bottom 43 of the hollow 41 in the hollow 41 have minimum thicknesses necessary for securing stiffness thereof.

Further the heat may be conducted by tightly contacting the bottom 43 and the thermal conducting plate 47 instead of the integral structure. There are various methods of contacting. For example, a soft metal with a high thermal conductivity such as copper, aluminum, and indium is interposed between the bottom 43 and the thermal conducting plate 47 and a normal pressure is applied thereto with bolts. For example, the bottom 43 and the thermal conducting plate 47 are made in tightly contact with each other to be combined with an adhesive. For example, grease with a high thermal conductivity is injected and a normal pressure is applied. These methods are low in cost than the method of manufacturing the vacuum vessel 3 with integral structure. If the vacuum vessel 3 is made of a material with a high thermal conductivity such as aluminum and copper, the vacuum vessel 3 also serves as the thermal conducting plate 47, so that the thermal conducting plate 47 can be omitted.

The hollow 41 is provided with the thermal insulator 46 to prevent heat from being transmitted by convection of air in the atmosphere. Further if the wall of the vacuum vessel 3 is sufficiently thin, the hollow 41 is unnecessary because thermal conduction in thickness direction of the wall is low. In that case, the thermal insulator 46 is still necessary to prevent heat from being transmitted by convection of air. To prevent the thermal conduction by the air flow convection, there is a method of vacuum thermal insulation. However, this method provides few merits in cost because it is costly to provide tubes and wirings in the tube through walls for vacuum.

The magnetic members 13a and 13b are provided with temperature sensors 30 for measuring temperatures thereof. Measured temperatures by the temperature sensors 30 are used as indirectly measured temperatures of the magnetic members 12a and 12b.

The measured temperatures of the magnetic members 12a, 12b, 13a, and 13b are supplied to temperature controllers 24 disposed outside the vacuum vessel 3 to control the first and second heat exchange devices 44 and 45 for supplying or absorbing the heat. One of the temperature controllers 24 controls supplying or absorbing heat in the first heat exchange device 44 and the second heat exchange device 45 disposed on the first vacuum vessel 3a on the basis of the temperatures of the magnetic members 12b and 13b disposed in the first vacuum vessel 3a. The other of the temperature controllers 24 controls supplying or absorbing heat in the first heat exchange device 44 and the second heat exchange device 45 disposed on the second vacuum vessel 3b on the basis of the temperatures of the magnetic members 12b and 13b disposed in the second vacuum vessel 3b.

Further, provided outside the vacuum vessel 3 are first power supply 28 and the second power supply 29 of which outputs are controlled by the temperature controller 24. There are two sets of the first power supply 28 and the second power supply 29. One set of the first power supply 28 and the second power supply 29 are disposed on the first vacuum vessel 3a and are controlled in output by the temperature controller 24 disposed on the first vacuum vessel 3a to control supplying or absorbing heat in the first and second heat exchange devices 44 and 45 disposed on the first vacuum vessel 3a. The other set of the first power supply 28 and the second power supply 29 are disposed on the second vacuum vessel 3b and are controlled in output by the temperature controller 24 disposed on the second vacuum vessel 3b to control supplying or absorbing heat in the first and second heat exchange devices 44 and 45 disposed on the second vacuum vessel 3b.

The heat generated and supplied by the first heat exchange device 44 is conducted through the bottom 43 to the thermal conducting plate 47 disposed on the vacuum side of the bottom 43 and further conducted from the thermal conducting plate 47 to the first thermal conducting members 25 and 27 disposed in vacuum, and to the magnetic members 12a, 12b, 13a, and 13b to increase the temperatures of the magnetic members 12a, 12b, 13a, and 13b. When the first heat exchange device 44 absorbs heat by discharging heat or the like, heat in the magnetic members 12a, 12b, 13a, and 13b is discharged through a transmission path reverse to the transmission path mentioned above, so that the temperatures of the magnetic members 12a, 12b, 13a, and 13b are decreased.

The first and second heat exchange devices 44 and 45, disposed on the atmospheric side of the vacuum vessel 3, can be replaced in which the vacuum state is kept if the first and second heat exchange devices 44 and 45 should be replaced due to maintenance.

Will be described a temperature control of the magnetic members 12a, 12b, 13a, and 13b.

Figure 5:
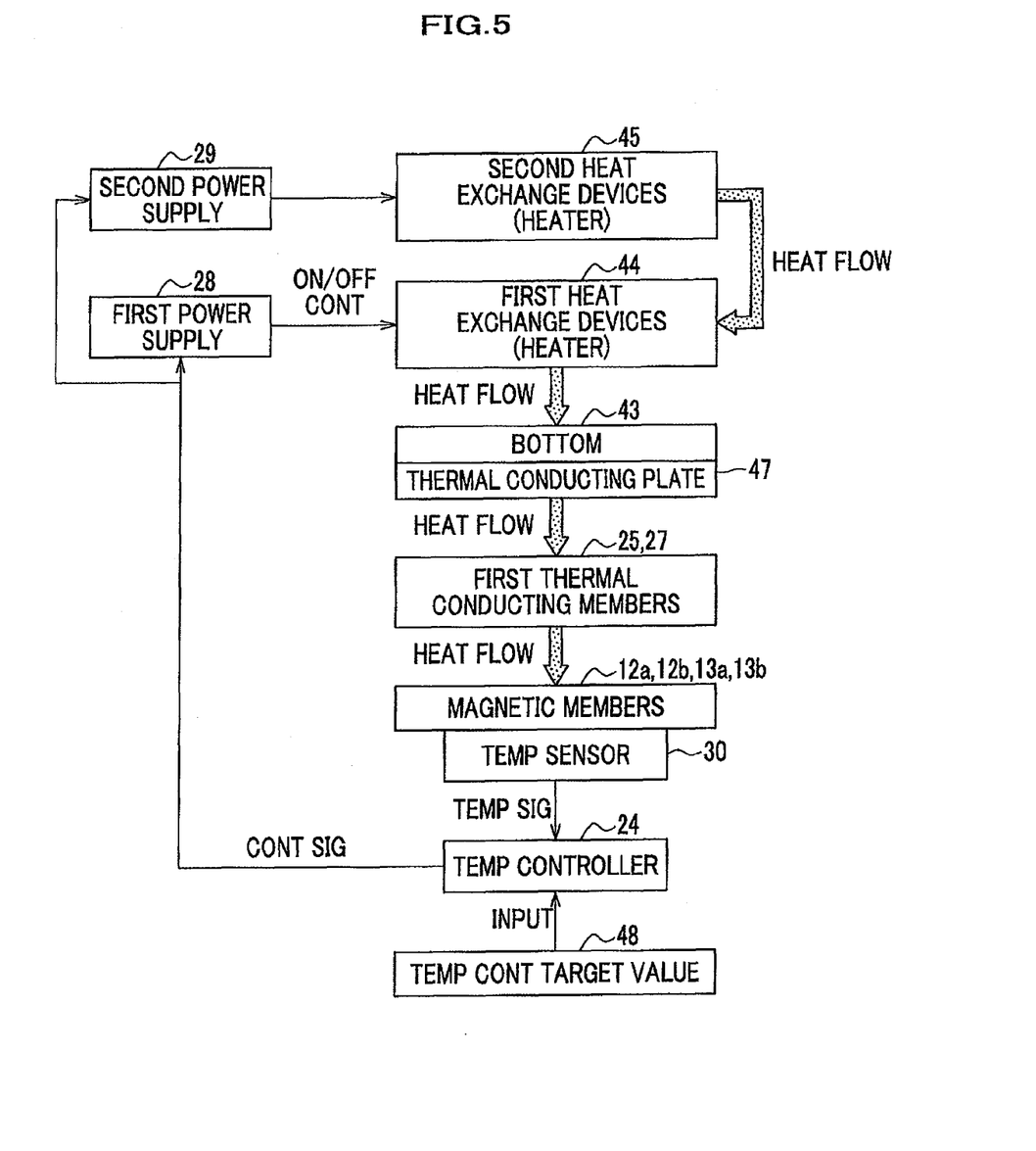
FIG. 5 is a block diagram of control according to the first embodiment of the present invention.

As shown in FIG. 5, the temperature sensors 30 disposed in the magnetic members 12a, 12b, 13a, and 13b measure the temperatures of the magnetic members 12a, 12b, 13a, and 13b and transmit temperature signals indicative of the measured temperatures to the temperature controllers 24. In the temperature controller 24, temperature control target values 48 as target temperature values for the magnetic members 12a, 12b, 13a, and 13b are input and stored. The temperature controller 24 compares temperatures indicated by the input temperature signals with the temperature control target 48 in magnitude to transmit control signals to the first power supply 28 and the second power supply 29 on the basis of comparison result. In response to the control signal the first power supply 28 controls supplying power to the first heat exchange device 44 between ON and OFF in accordance with the control signal. In response to the control signal the second power supply 29 controls supplying power to the second heat exchange device 45 between ON and OFF in accordance with the control signal. The first and second heat exchange devices 44 and 45 supply or absorb heat when a power is supplied to allow heat to flow between the vacuum vessel 3 (the bottom 43 in the hollow 41) and the thermal conducting plate 47.

The flow of heat provides heat conduction between the vacuum vessel 3 (the bottom 43 in the hollow 41) or the thermal conducting plate 47 and the first thermal conducting members 25 and 27. Further heat flows between the first thermal conducting members 25 and 27 and the magnetic members 12a, 12b, 13a, and 13b. Accordingly the temperatures of the magnetic members 12a, 12b, 13a, and 13b vary. Varied temperatures are measured by the temperature sensors 30. Formation of such a loop enables the temperature control to maintain the temperatures of the magnetic members 12a, 12b, 13a, and 13b constant around the temperature control target 48. Used as a method of controlling the temperatures may be a PID (proportional integral and differential) control method.

Further used as the first and second heat exchange devices 44 and 45 may be electric heaters. The electric heater can generate and supply heat, but cannot absorb heat by cooling. Accordingly, an electronic cooling by Peltier elements or the like may be used in addition to the electric heater. Here, if the magnetic members 12a, 12b, 13a, and 13b are disposed near so as to face the thermal shield 8 and the coil vessel 9, temperatures of the magnetic members 12a, 12b, 13a, and 13b decrease under the room temperature by absorption of heat by the thermal shield 8 and the coil vessel 9. Accordingly, making the temperature control targets 48 higher than the room temperature allows the temperature control only with the electric heaters.

Since the magnetic members 12a, 12b, 13a, and 13b, being disposed in a vacuum, are thermally insulated, if there is no above-mentioned temperature control, the temperatures of the magnetic members 12a, 12b, 13a, and 13b do not vary in a short time interval under short-term variation of the room temperature.

Here, although the magnetic members 12a, 12b, 13a, and 13b are thermally insulated, there is radiation heat from the vacuum vessel 3 to some extent. The radiation heat gradually varies the temperatures in accordance with the long-term variation in the room temperature. However, the temperature control mentioned above keeps the temperatures of the magnetic members 12a, 12b, 13a, and 13b constant irrespective of season or the like. Further the temperature control suppresses the long term temperature variation of the magnetic members 12a, 12b, 13a, and 13b under the long term variation in the room temperature. This suppresses variation of the homogeneousness of magnetic field in the homogenous magnetic field region 34.

If the superconducting magnet 2 is carried and installed at another location, the temperature of the magnetic members 12a, 12b, 13a, and 13b may increase or decrease by the ambient temperature during movement from the room temperature where the superconducting magnet 2 to be operated. Once having varied by some causes, the temperatures of the magnetic members 12a, 12b, 13a, and 13b do not become constant if there is no above-mentioned temperature control. In that case, it takes long time for the homogeneousness in the intensity of the magnetic field to become constant. Accordingly, the temperature of the magnetic field cannot be restored for a short time interval, so that the installation period becomes long. On the other hand, the above-mentioned temperature control can supply heat to or absorb heat from the temperatures of the magnetic members 12a, 12b, 13a, and 13b to equalize the temperatures of the magnetic members 12a, 12b, 13a, and 13b to the room temperature. This sets the temperatures of the magnetic members 12a, 12b, 13a, and 13b to the room temperature in a short time interval.

Further, to prevent the temperatures of the magnetic members 12a, 12b, 13a, and 13b from departing from the room temperature during movement of the superconducting magnet 2, the above-mentioned temperature control is conducted during the movement, wherein the temperature control target may be set to the room temperature at the destination of the movement. This process can set the temperatures of the magnetic members 12a, 12b, 13a, and 13b to the room temperature without time loss in installation.

Further, in the operation since the temperatures of the magnetic members 12a, 12b, 13a, and 13b are controlled by the above-mentioned temperature control, the temperatures are not largely different from the temperature control targets 48. Accordingly, the quantity of heat to be supplied or absorbed by the first heat exchange device 44 is not so large. Thus, it is sufficient to operate only the first heat exchange device 44 without operation of the second heat exchange device 45.

However, upon startup, the temperatures of the magnetic members 12a, 12b, 13a, and 13b may be largely different from the temperature control target 48. In such a case, in addition to the first heat exchange device 44, the second heat exchange device 45 is operated to supply heat or absorb heat from to more supply heat to or absorb heat from the magnetic members 12a, 12b, 13a, and 13b to make the temperatures of the magnetic members 12a, 12b, 13a, and 13b near the temperature control targets 48 within a short time interval.

The second heat exchange device 45 may be detachable to be removed during a general operation. This is because the second heat exchange device 45 is operated only during startup, and is removed from the superconducting magnet 2. Since the second heat exchange device 45 is installed outside the vacuum vessel 3, the second heat exchange device 45 can be easily detached.

As mentioned above, the magnetic members 12a, 12b, 13a, and 13b are supported in the vacuum vessel 3 with thermal insulation from the coil vessel 9. The first and second heat exchange devices 44 and 45, disposed on the atmospheric side, supply heat to or absorb heat from the magnetic members 12a, 12b, 13a, and 13b using the temperature sensor 30 installed in the magnetic members 13a and 13b to keep the temperatures of the magnetic members 12a, 12b, 13a, and 13b constant even if the room temperature varies. This makes variation in homogeneousness in magnetic field intensity in the homogenous magnetic region 34 extremely small. This provides a high performance MRI apparatus 1.

Further, the first and second heat exchange devices 44 and 45 are disposed outside the atmospheric side. Accordingly, if it becomes necessary to replace the first and second heat exchange devices 44 and 45, the first and second heat exchange devices 44 and 45 can be replaced without temperature increase or de-magnetization of the superconducting magnet 2.

Second Embodiment

Figure 6:
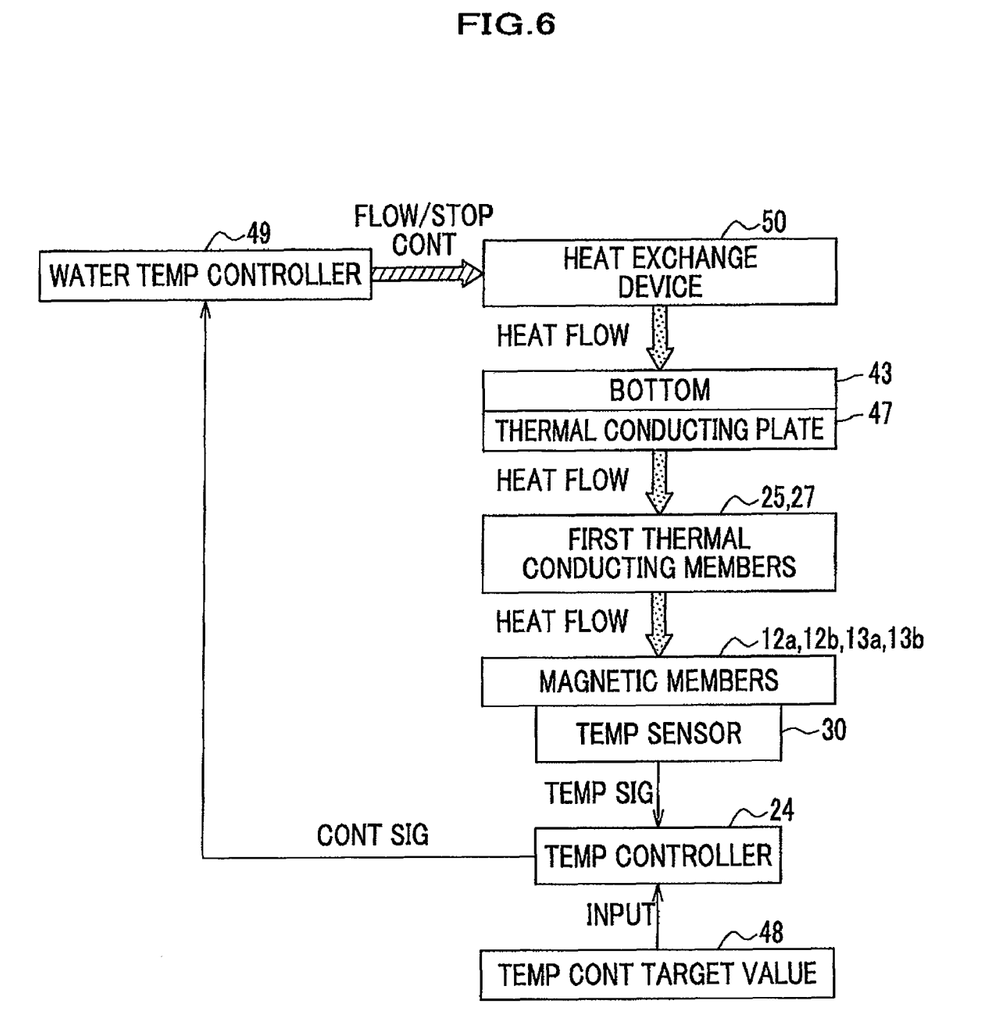
FIG. 6 is a block diagram of control according to the second embodiment of the present invention.

Next will be described the temperature control of the magnetic members 12a, 12b, 13a, and 13b of a second embodiment. The temperature control according to the second embodiment is substantially the same as the first embodiment. FIG. 6 shows the modification of the first embodiment as the second embodiment. In the second embodiment, a heat exchange device 50 is used instead the first heat exchange device 44. Accordingly, the first power supply 28 is replaced with a water temperature controller 49. The water temperature controller 49 and the heat exchange device 50 conduct temperature control using a fluid such as water. In the temperature control of the fluid, there is an advantageous effect that cooling is easily carried out in addition to warming.

The invention claimed is:

1. A superconducting magnet, comprising:
   an annular superconducting coil that generates a magnetic field;
   a coil vessel that contains the superconducting coil with a refrigerant;
   a vacuum vessel that has a vacuum space therein and encloses the coil vessel in the vacuum space;
   a magnetic member disposed in the vacuum space and supported by the coil vessel with thermal insulation that compensates the magnetic field;
   a heat exchange device disposed outside the vacuum vessel that is thermally connected to the vacuum vessel to supply heat to the vacuum vessel or absorbs heat from the vacuum vessel; and
   a thermal conducting member disposed in the vacuum space that is thermally connected to the magnetic member and the heat exchange device via the vacuum vessel.

2. The superconducting magnet as claimed in claim 1, further comprising a temperature sensor that measures a temperature of the magnetic member; and
   a temperature controller that controls supplying or absorbing the heat in the heat exchange device on the basis of the measured temperature.

3. The superconducting magnet as claimed in claim 1, wherein the heat exchange device is thermally connected to an outside surface of a wall of the vacuum vessel and the thermal conducting member is oppositely, thermally connected to an inside surface of the wall of the vacuum vessel.

4. The superconducting magnet as claimed in claim 1, wherein the thermal conducting member has a flexibility.

5. The superconducting magnet as claimed in claim 1, wherein the thermal conducting member comprises a plurality of thermal conducting members that are thermally connected to the vacuum vessel and the plurality of magnetic members, respectively.

6. The superconducting magnet as claimed in claim 1, wherein the magnetic member comprises a plurality of magnetic members disposed apart from each other, the superconducting magnet further comprising another thermal conducting members that are disposed in the vacuum space of the vacuum vessel and thermally connects the plurality of magnetic members.

7. The superconducting magnet as claimed in claim 1, further comprising a thermally conducting plate that is disposed between a wall of the vacuum vessel and the thermal conducting member, thermally connects the vacuum vessel to the thermally conducting member, and has a thermal resistance smaller than the vacuum vessel.

8. The superconducting magnet as claimed in claim 1, wherein the vacuum vessel comprises a hollow, the heat exchange device is disposed on a bottom of the hollow, the vacuum vessel in the hollow is smaller in thickness than parts of the vacuum vessel other than the hollow.

9. The superconducting magnet as claimed in claim 1, further comprising a thermal insulator covering the heat exchange device.

10. The superconducting magnet as claimed in claim 1, further comprising another heat exchange device that is detachably disposed outside the vacuum vessel and thermally connected to the vacuum vessel to supply or absorb heat with a capacity greater than the heat exchange device.

11. The superconducting magnet as claimed in claim 1, wherein
    the superconducting coil comprises a pair of superconducting coils facing with each other;
    the coil vessel comprises a pair of coil vessels;
    the vacuum vessel comprises a pair of vacuum vessels;
    the magnetic member comprises a pair of magnetic members;
    the heat exchange device comprises a pair of heat exchange devices, wherein the pair of coil vessels, the pair of vacuum vessels, the pair of magnetic members, and the pair of heat exchange devices are disposed so as to make the pair of the superconducting coils facing with each other to form the magnetic field between the pair of vacuum vessels.

12. The superconducting magnet as claimed in claim 1, further comprising a thermal shield enclosing the coil vessel, and the magnetic member is disposed outside the thermal shield.

13. A magnetic resonance imaging apparatus comprising:
    a superconducting magnet as claimed in claim 1;
    a radio frequency coil for receiving a nuclear magnetic resonance signal from a given location of the subject; and
    a control unit for analyzing the nuclear magnetic resonance signal to generate a magnetic resonance image.

* * * * *